United States Patent [19]

Tanaka

[11] Patent Number: 4,584,489
[45] Date of Patent: Apr. 22, 1986

[54] MULTICHANNEL TIME-VOLTAGE CONVERTER

[75] Inventor: Masaru Tanaka, Kyoto, Japan

[73] Assignee: Horiba, Ltd., Kyoto, Japan

[21] Appl. No.: 634,118

[22] Filed: Jul. 24, 1984

[30] Foreign Application Priority Data

Aug. 2, 1983 [JP] Japan .......................... 58-120973[U]

[51] Int. Cl.$^4$ .......................... H03L 5/00; H03K 5/19
[52] U.S. Cl. ..................................... 307/264; 307/519;
    307/352; 307/242; 328/62; 328/130.1; 328/151;
    328/140
[58] Field of Search ............... 307/228, 519, 524, 352,
    307/353, 242, 264; 328/127, 62, 105, 130.1, 140,
    150, 151, 181, 183, 185

[56] References Cited

U.S. PATENT DOCUMENTS

| 4,066,919 | 1/1978 | Huntington | 307/353 |
| 4,166,248 | 8/1979 | Bianchi et al. | 328/140 |
| 4,502,049 | 2/1985 | Atkinson | 340/825.73 |
| 4,523,108 | 6/1985 | Niiho et al. | 307/353 |

*Primary Examiner*—Stanley D. Miller
*Assistant Examiner*—Richard Roseen
*Attorney, Agent, or Firm*—Wenderoth, Lind & Ponack

[57] ABSTRACT

A multichannel time-voltage converter generates a plurality of output voltages which respectively corresponds to the time period between a start pulse and each of a plurality of stop pulses. A single sawtooth wave generator is utilized with a plurality of track and hold circuits so as to obviate the need for separately calibrating each of the plurality of channels of the converter.

2 Claims, 4 Drawing Figures

MULTICHANNEL TIME-VOLTAGE CONVERTER

BACKGROUND OF THE INVENTION

1. Field of the Invention

This invention relates to a multichannel time-voltage converter.

The multichannel time-voltage converter is used, for example, when a sample is excited by pulsed light and photoelectrons generated from the sample are detected so as to thereby measure the lifetime of the emission from the sample.

2. Description of the Prior Art

Conventionally, this kind of multichannel time-voltage converter, for example, as shown in FIG. 1, has been proposed, in which when a first terminal $T_1$ is fed a start signal, a start switch 1 is used to start the charging of capcitors $C_1$, $C_2$, and $C_3$ by a power source 2, and when a second input terminal $T_2$ is fed stop pulses one after another, stop switches $S_1$, $S_2$ and $S_3$ are respectively sequentially turned off in correspondance with the stop pulses so as to thereby stop the charging of capacitors $C_1$, $C_2$ and $C_3$.

Such a construction, however, is arranged such that a plurality of time-voltage converters are connected in parallel to only one power source so as to be multichanneled, whereby the circuit constants based on capacitors $C_1$, $C_2$, and $C_3$ and resistances $R_1$, $R_2$, and $R_3$ at each channel is slightly different so as to cause a shift in the charging waveform at each capacitor $C_1$, $C_2$, or $C_3$, thereby creating a problem in that it is extremely difficult to make these waveforms closely correspond. In addition, the circuit construction is complex.

SUMMARY OF THE INVENTION

In order to solve the above problem, this invention has been designed. An object thereof is to provide a multichannel time-voltage converter which is so constructed that one sawtooth wave generator is connected to a plurality of tracking hold circuits so that its stop switches are adapted to be turned off sequentially each time a stop pulse is fed to the circuit, whereby a single charging sawtooth wave generator capacitor is usable in common with a plurality of channels, thereby resulting in a simplified circuit in which the conformation adjustment of the charging waveform for each channel is not required.

The above and further objects and novel features of the invention will more fully appear from the following detailed description when the same is read in connection with the accompanying drawings.

DESCRIPTION OF THE PREFERRED EMBODIMENT

Figure 1:
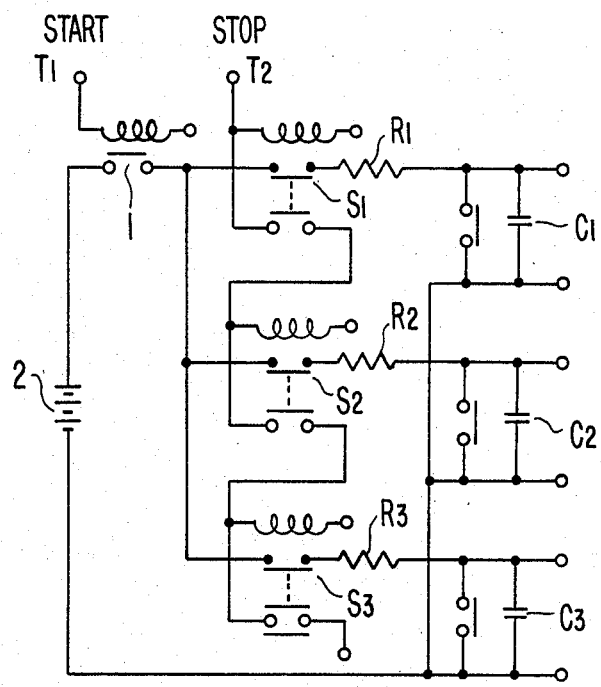
FIG. 1 is a circuit diagram of a conventional multichannel time-voltage converter.
Figure 2:
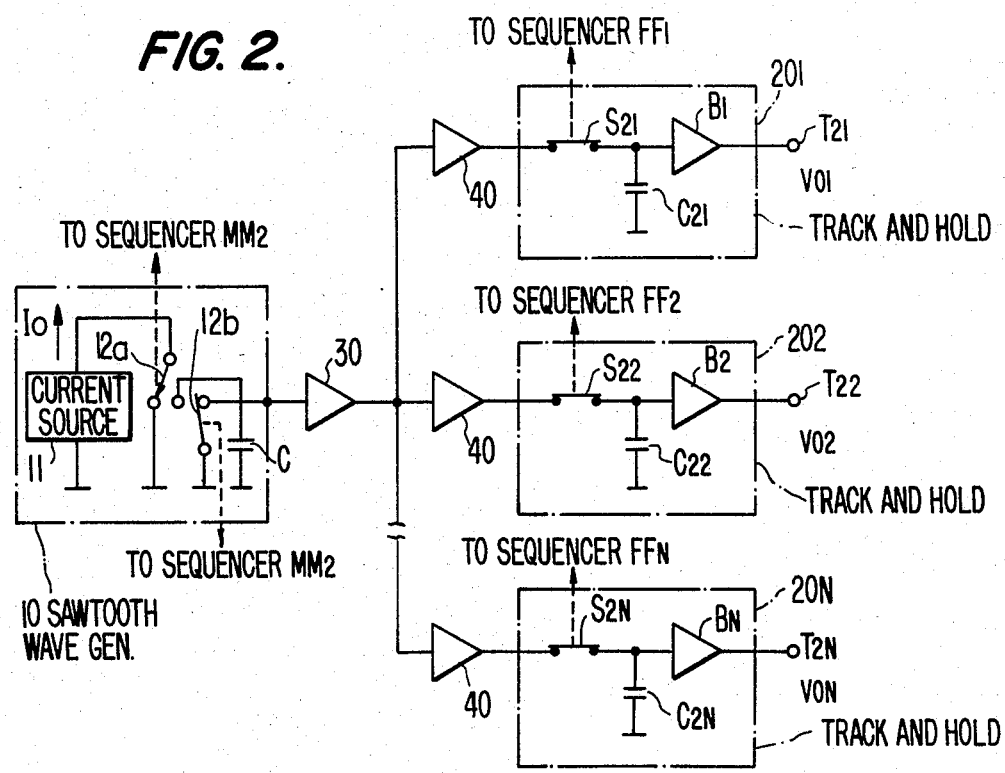
FIG. 2 is a circuit diagram of an embodiment of a multichannel time-voltage converter of the present invention.

FIG. 2 is a circuit diagram of an embodiment of a multichannel time-voltage converter of the invention, in which reference numeral 10 designates a sawtooth wave generator circuit, which generates voltage in proportion to the lapse of time and comprises a constant current source 11, changeover switches 12a and 12b, and a charging capacitor C. Elements 201, 202, ..., and 20N designate tracking hold circuits (to be hereinafter called the TH circuit) connected to the output line of the sawtooth wave generator circuit 10 and forming a plurality of channels, the first TH circuit 201 comprising a stop switch $S_{21}$, a capacitor $C_{21}$, and a buffer amplifier $B_1$; $T_{21}$ designates an output terminal of the first TH circuit 201. Thus, the TH circuits are similarly formed up to the Nth circuit 20N. In addition, 30 and 40 designate buffer amplifiers. All of the buffer amplifiers may or may not be necessary, depending on the particular application.

It is noted that the constant current source 11 and switch 12a may comprise Part No. SP9768 which is manufactured by the Plessy Company Ltd. and the switch 12b may comprise Part No. HI-201 HS which is manufactured by the Harris Corporation. The track and hold circuits (e.g. - switch $S_{21}$ and capacitor $C_{21}$) may comprise Part No. HTS-0025 which is manufactured by ANALOG DEVICES, Inc.

Figure 3:
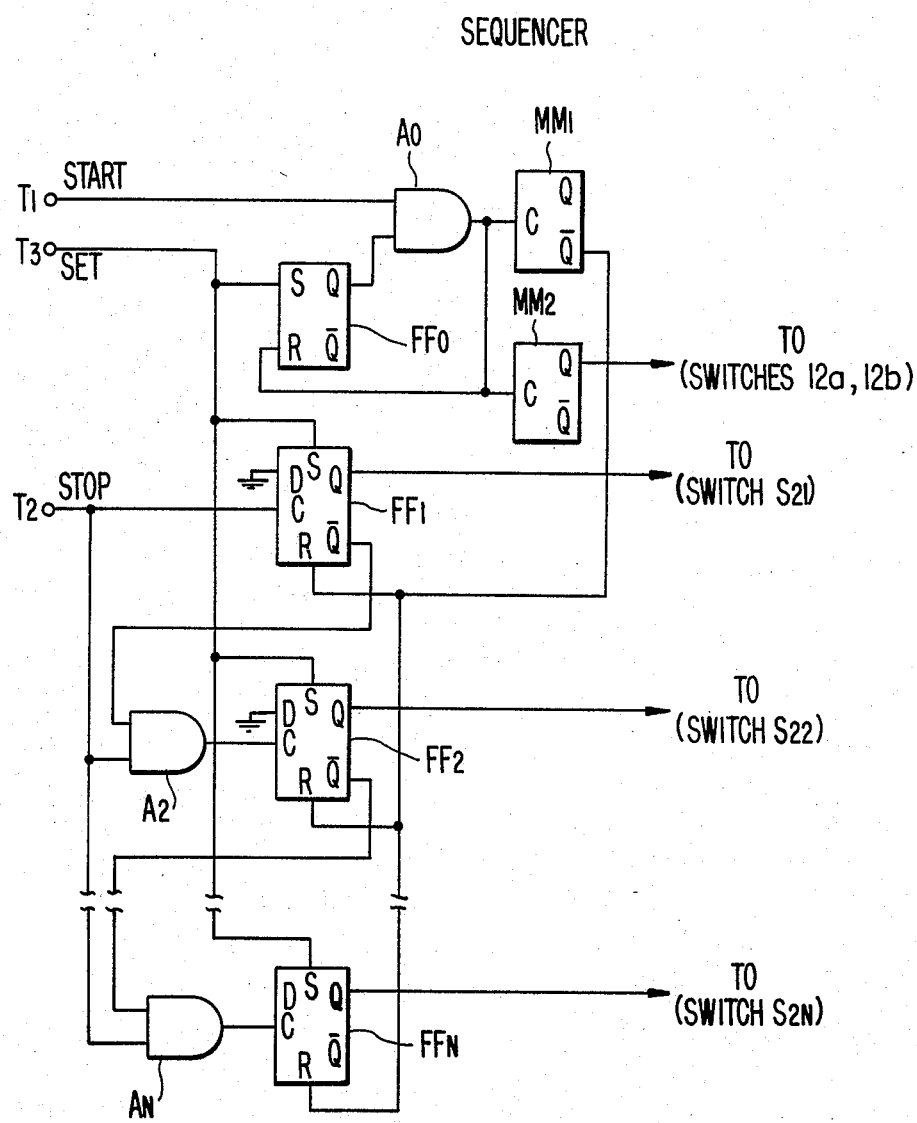
FIG. 3 is a circuit diagram exemplary of a sequencer used in the present invention.

FIG. 3 is a circuit diagram exemplary of a sequencer for generating the necessary sequence for operation of the aforesaid converter, the sequencer comprises flip-flops $FF_0$ to $FF_N$, monostable multivibrators $MM_1$ and $MM_2$, and AND circuits $A_0$, $A_2$, ..., $A_N$.

Figure 4:
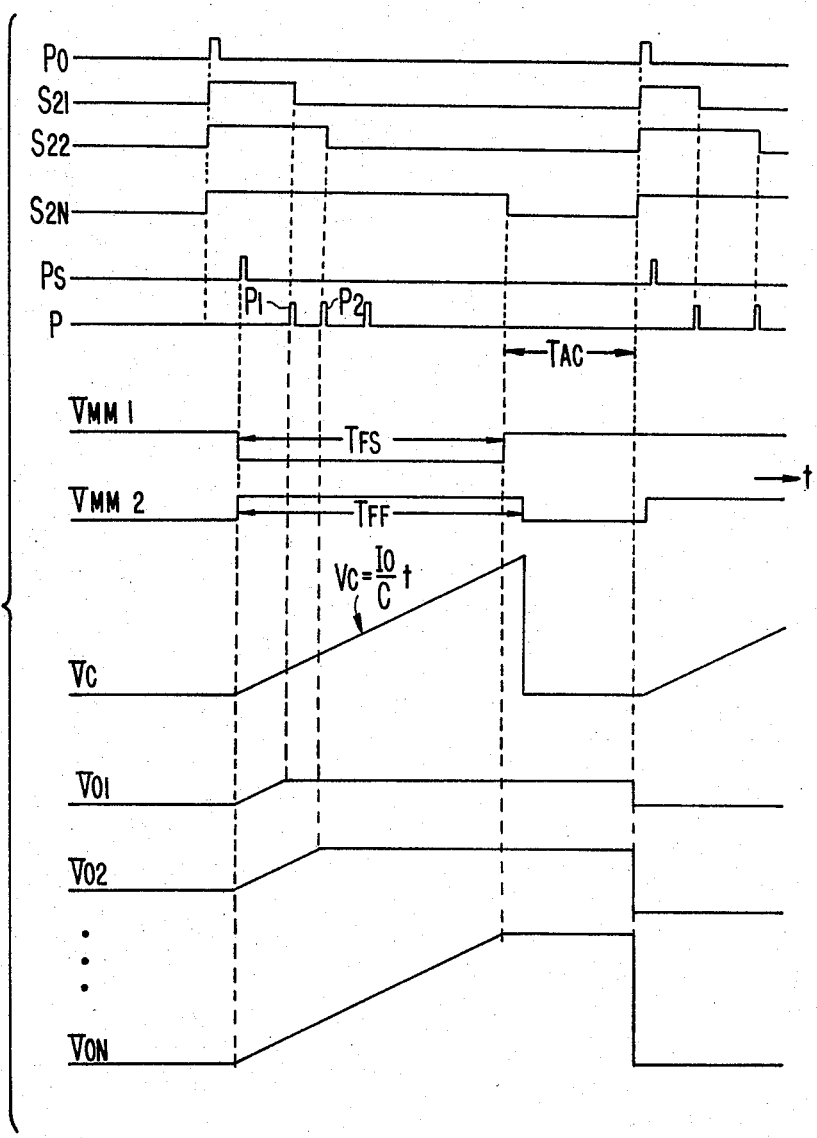
FIG. 4 is an illustration of the operation of the FIG. 2 embodiment.

Next, an explanation will be given on the operation of the converter in accordance with the present invention with reference to FIG. 4, in which all of the TH circuits 201 to 20N are assumed to be in the hold condition as their initial condition.

Step 1—Upon feeding a set pulse $P_0$ into an input terminal $T_3$, signals at a high level are delivered from the Q terminals of the flip-flops $FF_1$ through $FF_N$ to the switches $S_{21}$ through $S_{2N}$ so as to turn on each stop switch. As a result, capacitors $C_{21}$ to $C_{2N}$ of the circuits 201 to 20N are respectively connected to the output line of sawtooth wave generator 10 through the buffer amplifiers 30 and 40.

At the same time, since a signal at a high level is output from the Q terminal of flip-flop $FF_0$ to an AND circuit $A_0$, the circuit $A_0$ is kept in a condition for allowing a signal from input terminal $T_1$ to pass therethrough.

Step 2—Next, upon feeding a start pulse $P_S$ into input terminal $T_1$, an output from AND circuit $A_0$ is fed into the monostable multivibrator $MM_2$, and from the Q terminal thereof, a high level signal is fed to changeover switches 12a and 12b, whereby the switch 12a is turned on and switch 12b is turned off. As a result, the constant current source 11 charges the capacitor C and a voltage $V_C$ across both terminals thereof rises, so that when the current of constant source is represented by $I_0$, the capacity of capacitor C is represented by C, and the time is represented by t, the voltage is given as $$V_c = \frac{I_0}{c} t.$$

At the same time, voltage $V_{01}$ to $V_{0N}$ across the terminals of capacitors $C_{21}$ to $C_{2N}$ of the TH circuits 201 to 20N all rise in waveforms similar to that of the voltage $V_C$.

Step 3—When a first stop pulse $P_1$ (to be generally called P) is fed into the input terminal $T_2$, since the AND circuits $A_2$ to $A_N$ are not in a condition for passing a signal, the pulse $P_1$ is only fed to the flip-flop $FF_1$ and its Q terminal that outputs a low level. As a result, only the stop switch $S_{21}$ is turned off so as to disconnect the capacitor $C_{21}$ from the sawtooth wave generator circuit 10 so as to thereby stop its charging, but hold the terminal voltage $V_{01}$.

At the same time, the AND circuit $A_2$ is fed the signal from the $\overline{Q}$ terminal of flip-flop $FF_1$, thereby being putting it in a condition for allowing a signal to pass through the AND circuit $A_2$.

Step 4—Next, upon feeding a second stop pulse $P_2$ into the input terminal $T_2$, since only the AND circuit $A_2$ is in a condition for passing a signal, the pulse $P_2$ is only fed to the flip-flop $FF_2$ and its Q terminal thereby outputs a low level. As a result, only the stop switch $S_{22}$ is turned off so as to disconnect the capacitor $C_{22}$ from the sawtooth wave generator circuit 10, whereby the charging is stopped, but the terminal voltage $V_{02}$ is held.

At the same time, an AND circuit $A_3$ (not shown) is fed the signal from the $\overline{Q}$ terminal of the flip-flop $FF_2$, thereby putting it in a condition for allowing a signal to pass.

Step 5—Thereafter, each time a stop pulse P is fed in the input terminal $T_2$, the Nth stop pulse $P_N$, in the same operation as in steps 3 and 4 above, turns off the Nth stop switch $S_{2N}$.

In addition, even when the stop pulse P does not occur, after the lapse of setup time $T_{FS}$ by the monostable multivibrator $MM_1$, the output from the $\overline{Q}$ terminal of the monostable multivibrator $MM_1$ resets all of the flip-flops $FF_1$ to $FF_N$ so as to thereby turn off all of the stop switches $S_{21}$ to $S_{2N}$.

Step 6—Voltages proportional to the time from the arrival of the start pulse $P_S$ to arrival of the respective stop pulses $P_1$ through $P_N$ are developed as the respective output voltages $V_{01}$ to $V_{0N}$ for the aforesaid setup time $T_{FS}$. When the stop pulse P does not occur, as abovementioned, its output voltage appears as a voltage corresponding to the setup time $T_{FS}$, which is not used as data.

Step 7—Since each data is effective for a time period $T_{AC}$ from a finish of setup time $T_{FS}$ to the input of the next set pulse $P_0$ after the stop switch $S_{2N}$ is turned off, the processing, such as A-D conversion, may occur as needed within this time period.

Step 8—After the lapse of the setup time $T_{FF}$ ($T_{FF} > T_{FS}$) set by the monostable multivibrator $MM_2$, the output from the Q terminal of the monostable multivibrator $MM_2$ turns the changeover switch 12a off and turns switch 12b on, thereby resetting the voltage of capacitor C and restoring the converter to its initial state.

In a case where a distortion is developed in the waveform of voltage $V_C$ at the capacitor C during the switching of changeover switches 12a and 12b, the stop pulse P is delayed for a predetermined time so that a voltage value corresponding to the delay time may be subsequently deducted from the data.

While a preferred embodiment of the inveniton has been described using specific terms, such description is for illustrative purpose only, and it is to be understood that changes and variations may be made without departing from the spirit or scope of the following claims.

I claim:

1. A multichannel time-voltage converter for generating a plurality of voltages which respectively correspond to the time period between a start pulse and each of a plurality of stop pulses, said converter comprising:
    a sawtooth wave generator circuit for generating a sawtooth wave;
    a plurality of track and hold circuits having their inputs connected to an output of said sawtooth wave generator and having separate outputs for each of said plurality of circuits;
    a sequencer means operatively connnected to said sawtooth wave generator and to said plurality of track and hold circuits for controlling said generator and said circuits in response to said start pulse and said plurality of stop pulses which are input thereto;
    wherein said sequencer starts generation of a sawtooth wave in response to said start pulse and causes said plurality of track and hold circuits to respectively sequentially track and hold a value of said sawtooth wave in response to said stop pulses such that the time period between said start pulse and each of said plurality of stop pulses are converted to respective voltages which are held and output by respective track and hold circuits.

2. A multichannel converter as in claim 1, wherein said sequencer means comprises a plurality of flip-flops which have their outputs respectively connected to said track and hold circuits and a plurality of gate circuits connected to said flip-flops such that each of said stop pulses changes a state of just one of said flip-flops.

* * * * *